United States Patent [19]
Seki et al.

[11] 3,728,638
[45] Apr. 17, 1973

[54] TRANSISTORIZED POWER AMPLIFIER CIRCUIT

[75] Inventors: Kunio Seki; Seiji Okuda, both of Tokyo, Japan

[73] Assignee: Hitachi, Ltd., Tokyo, Japan

[22] Filed: July 13, 1971

[21] Appl. No.: 162,142

[30] Foreign Application Priority Data

July 13, 1970 Japan ....................................45/60626

[52] U.S. Cl. ..........................330/18, 330/19, 330/25, 330/207 P

[51] Int. Cl. ....................................................H03f 3/42

[58] Field of Search......................330/15, 18, 19, 25, 330/38 M, 207 P

[56] References Cited

UNITED STATES PATENTS

| | | | |
|---|---|---|---|
| 3,376,388 | 4/1968 | Reiffin | 330/15 X |
| 3,374,441 | 3/1968 | Karcher | 330/25 X |
| 3,436,667 | 4/1969 | Kedson | 330/18 UX |

OTHER PUBLICATIONS

Hood, "Simple Class A Amplifier," Wireless World, April 1969, pp. 148–153.

Teague, "Get PNP Class–B Stage Efficiency," Electronic Design 6, March 15, 1967, pp. 238–240.

Buegel, "125 Watts per Channel Stereo Amplifier," Radio–Electronics, Apr. 1969, pp. 41–44.

*Primary Examiner*—Roy Lake
*Assistant Examiner*—James B. Mullins
*Attorney*—Craig, Antonelli & Hill

[57] ABSTRACT

A transistorized power amplifier circuit comprises an input transistor circuit capable of class-A amplifier operation according to base input and collector output, a first and a second output transistor, and a diode coupling circuit receiving the collector output from the input transistor circuit as an input signal thereof for alternatively driving the output transistors into conduction at each successive half cycle of the input signal. A DC negative feedback circuit is connected between the output terminal of the output transistors and the emitter of the input transistor, and all the transistors are of the same conduction characteristic.

3 Claims, 1 Drawing Figure

Q1 ............ 2SC458LG

Q2 ............ 2SC458L

Q3 ............ HS6011

Q4 , Q5 ...... 2SC1162

D1～D4 ...... HV26

PATENTED APR 17 1973 3,728,638
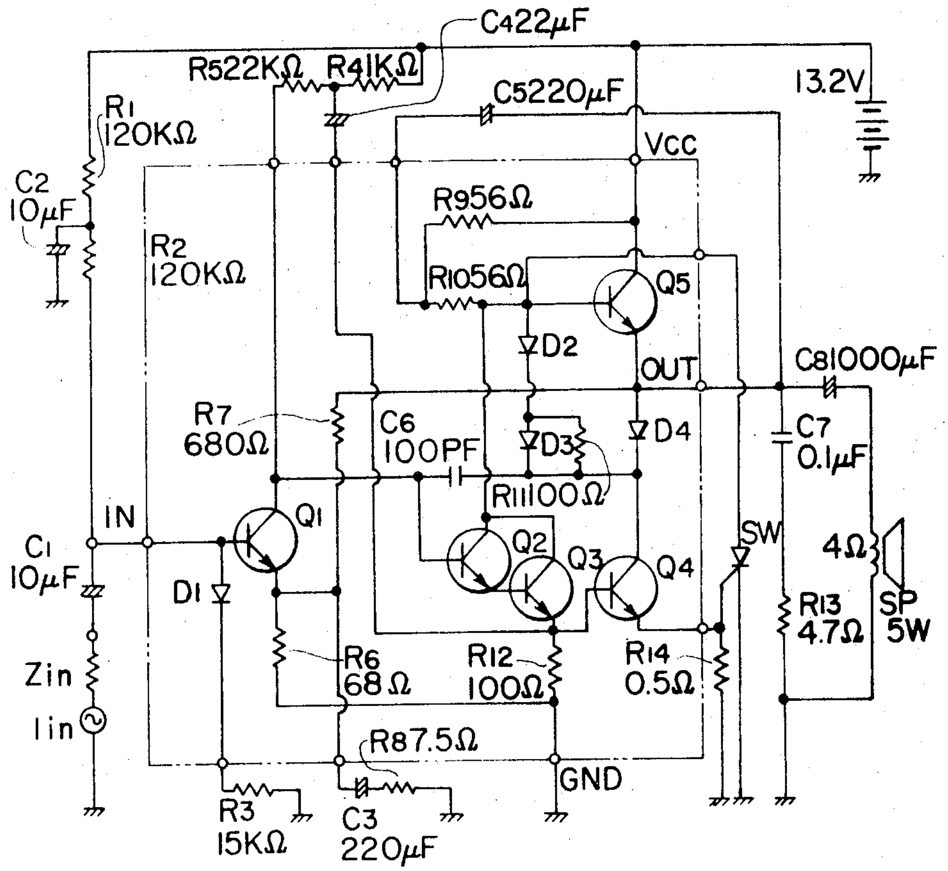
Q1 ------- 2SC458LG
Q2 ------ 2SC458L
Q3 ------ HS6011
Q4, Q5 --- 2SC1162
D1 ~ D4 --- HV26
INVENTORS
KUNIO SEKI and SEIJI OKUDA
BY
Craig, Antonelli & Hill
ATTORNEYS

TRANSISTORIZED POWER AMPLIFIER CIRCUIT

This invention relates to power amplifier circuits using transistors and more particularly to direct-coupling transistor amplifier circuits using transistors of NPN type only ( or PNP type only ).

Generally, a method in which transistors are connected to each other directly or by way of resistors ( not by way of capacitors or transformers ) is employed for transistorized power amplifier circuits. A typical example of this type of circuit is the complementary amplifier circuit using PNP and NPN transistors in combination. In such a complementary circuit, it is difficult to establish characteristic matching between PNP and NPN transistors. Furthermore, there are difficulties in forming a complementary power amplifier circuit into one semiconductor slice built as an integrated circuit device or a complex circuit device comprising characteristically matched PNP and NPN transistors.

A power amplifier circuit using transistors of NPN type only ( or PNP type only ) is disclosed in Japanese Pat. Publication No. 45–2402 ( 1970). This amplifier circuit comprises a differentially connected input transistor circuit, a constant current source circuit, a level shifting circuit and two output transistor circuits. According to this prior art, a large number of transistors are required, resulting in a costly amplifier, or the yield is lowered when the amplifier is constructed into a semiconductor slice as a semiconductor integrated circuit device or a complex circuit device.

In view of the foregoing, an object of this invention is to provide a structurally simple power amplifier circuit using transistors only of NPN ( or of PNP ) wherein the number of transistor used is reduced.

Another object of this invention is to provide a structurally simple and operationally efficient power amplifier circuit formed without using a differentially connected input transistor circuit, a stablized current source circuit and a level shifting circuit.

Another object of this invention is to provide a power amplifier circuit readily constructable in the emitter of the input transistor by way of a DC negative feedback circuit connected between the output side of the output transistor circuit and the emitter of the input transistor whereby both the reference DC voltage and the reference DC voltage variation due to any gain difference between the first and the second output transistor are kept at desired values, and the output waveforms are suitably shaped.

According to the present invention, it is desirable that the input transistor circuit and output transistors are coupled to each other by way of a class-A emitter follower circuit comprising one transistor or plurality of transistors connected in Darlington form. This arrangement makes it possible to establish thorough impedance matching between the output of the input transistor circuit and the input of the output transistor.

The invention will be further illustrated by the following nonlimitative example taken in conjunction with the accompanying drawing.

The single FIGURE of the drawing is a circuit diagram showing a transistor power amplifier embodying this invention.

Referring to the drawing, there is shown a circuit wherein an area encircled by the dotted line denotes a circuit which can be readily formed unitary into one semiconductor slice as a semiconductor integrated circuit.

The part outside the encircled dotted line is formed independent of the integrated circuit, and later is connected to the separately formed integrated circuit via terminals indicated by *o* dots at which the dotted line crosses the full lines of the circuit.

In the FIGURE, the reference $Q_1$ denotes an input transistor, $D_1$ a varistor for temperature voltage compensations, $R_1$ , $R_2$ and $R_3$ resistors for biasing the base of the input transistor, $C_1$ a DC blocking capacitor, $R_6$ an emitter resistor, $C_3$ and $R_8$ a highpass filter for compensating the frequency characteristics of the circuit, $R_5$ a collector load resistor and $C_2$ is ripple filter for the power source. These elements constitute an input transistor circuit.

The reference $Q_4$ denotes a first output transistor, $Q_5$ a second output transistor, $D_4$ a diode for coupling the output transistors $Q_4$ and $Q_5$ , $D_2$ , $D_3$ and $R_{11}$ represent diodes and a resistor respectively, for compensating the dead zone produced by the voltage drop across the base-emitter of the second output transistor $Q_5$ and by the forward voltage drop across the diode $D_4$ and $R_9$ and $R_{10}$ are base biasing resistors for the second output transistor $Q_5$.

The reference $R_7$ denotes a feedback resistor connected between the output point OUT of the two output transistors and the emitter of the input transistor $Q_1$ , $C_5$ is a capacitor for the transistor $Q_5$ for bootstrap operation.

The transistors $Q_2$ and $Q_3$ connected in Darlington form constitute an emitter follower type class-A transistor amplifier circuit which is connected between the collector of the input transistor $Q_1$ and the base of the first output transistor $Q_4$ . Resistor $R_{12}$ is an emitter load resistance for the transistor $Q_3$ . In the circuit having a transistorized amplifier circuit disposed in the above manner, care must be taken when supplying power to the collector of the output transistor $Q_3$ . More specifically, according to this invention, no differential amplifier is used for the input transistor circuit and , hence, it is important for the resistor $R_1$ and capacitor $C_2$ to have large time constants. In other words, a considerable amount of time lag is produced to start operating a circuit after connecting the power source to the power terminal Vcc. During this time lag, the base of the input transistor $Q_1$ stands at about OV, and a high voltage is applied to the collector of the input transistor $Q_1$ and to the base of the transistor $Q_2$ . If, in this circuit, the collectors of the transistors $Q_2$ and $Q_3$ are connected directly to the power terminal Vcc, a large current flows in the collectors of the transistors $Q_2$ and $Q_3$ , and these transistors may be damaged. To avoid this, it is necessary to provide a current limiting circuit ( for example, a resistor ) to be connected to the collectors of the transistors $Q_2$ and $Q_3$ . According to this embodiment, the resistors $R_9$ and $R_{10}$ are used also for current limiting , whereby the number of the circuit elements does not need to be increased. Another method for avoiding the large current flow is to connect the collectors of the transistors $Q_2$ and $Q_3$ to the collector of the first output transistor. This method, however, is not desirable for power amplifier circuits which are to handle large current, because the rising characteristic of the collector current of the first output transistor is deteriorated.

In the single FIGURE, reference $C_4$ denotes a bootstrap capacitor, and $C_6$ a high frequency band phase compensating capacitor useful for stabilizing the circuit. The references $C_7$ and $R_{13}$ are a high frequency band phase compensating capacitor and resistor respectively. Furthermore, $C_8$ is a condensor necessary to operate the above circuit by single power source. A condensor having a large capacity is used as the condensor $C_8$ in order to sufficiently operate the low frequency band and the speaker SP is connected to the condensor $C_8$ as the load.

The present invention is further characterized in that when the base of the second output transistor is short-circuited to the ground electrode terminal GND, the transistor $Q_5$ turns off, the potentials at the output terminal OUT and at the collector of the transistor $Q_4$ connected to the transistor $Q_5$ via the diodes $D_2$ and $D_3$ become nearly zero, the potential at the emitter of the input transistor becomes also nearly zero and, as a result, the base potential of the transistor $Q_2$ becomes sufficiently small. When the collectors of the transistors $Q_2$ and $Q_3$ are connected to the base of the second output transistor $Q_5$ , the collector voltage of the transistor $Q_5$ becomes nearly zero. Therefore, in the event a large current flows in the output transistor due to the reason, such as load short-circuit, such a large current is immediately detected, whereby the base of the second output transistor $Q_5$ is short-circuited to the terminal GND. By this arrangement, the transistors $Q_2$ , $Q_3$ , $Q_4$ and $Q_5$ are all easily and perfectly protected against large currents, without using a significant amount of power. To this effect, an excess current detecting resistor $R_{14}$ is connected to the emitter of the first output transistor $Q_4$, and a bistable negative resistance switching element SW SUCH as, for example, an SCR is inserted into the circuit as shown in the FIGURE. This simple arrangement is sufficient for protecting the transistors against heavy currents. A desirable transistor protection method according to this invention is such that a region having the same conductivity type as the collector regions of the transistors is formed in the semiconductor slice during the process for forming transistors, two regions having the same conductivity type as the bases of the transistors are formed in the surface of the above-mentioned region during the diffusion process for forming the bases, a region having the same conductivity type as the emitter of the transistors is formed in the surface of one of said two regions during the diffusion process for forming the emitters of the transistors, and thus a negative resistance switching element having a PNPN structure is formed within the semiconductor integrated circuit device.

While a specific embodiment of the invention has been described above, it is understood that the invention is not limited thereto or thereby. For example, the diodes $D_2$ through $D_4$ are not necessarily of the PN junction type. Various diodes comprising a transistor structure having its collector connected to the base, collector connected to emitter, or base connected to emitter may be used . What is essential for the diode is that such element is capable of changing its impedance according to the direction of current flowing therein . Also, any transistor used for the purpose of the invention is not limited to a single PNP or NPN type transistor. For example, a complex circuit device comprising transistors connected in Darlington form is considered equivalent to one transistor according to this invention.

We claim:

1. A transistor power amplifier circuit comprising:
- an input transistor circuit capable of class-A amplifier operation according to base input and collector input including a first transistor and an emitter resistor connected to the emitter of said first transistor;
- an output transistor circuit capable of class-B amplifier operation including a second and a third transistor of the same conduction characteristic as said first transistor, a first diode means connected between the emitter of said second transistor and the collector of said third transistor, a second and a third diode means connected in series between the base of said second transistor and the collector of said third transistor so as to make said second and third transistors operate in class-B, and an output terminal connected to the emitter of said second transistor;
- a circuit means for coupling the collector of said first transistor with the base of said third transistor; and
- a DC negative feedback means connected between the emitter of said second transistor and the emitter of said first transistor so as to maintain the biasing potential of said second and third transistors to a predetermined value.

2. A circuit according to claim 1, wherein said coupling circuit means comprises an emitter-follower transistor circuit having a fourth transistor of the same conduction characteristic as said first transistor with a base connected to the collector of said first transistor and an emitter connected to the base of said third transistor.

3. A circuit according to claim 1, wherein said feedback means comprises a resistor connected between said output terminal and the emitter of said first transistor.

* * * * *